(12) United States Patent
Privett et al.

(10) Patent No.: US 6,731,503 B2
(45) Date of Patent: May 4, 2004

(54) ELECTRICALLY ISOLATED MODULE

(75) Inventors: Zollie W. Privett, Baltimore, MD (US); Brian R. Crowell, Newark, PA (US); Robert J. Opsitos, Jr., Felton, PA (US)

(73) Assignee: Black & Decker Inc., Newark, DE (US)

( * ) Notice: Subject to any disclaimer, the term of this patent is extended or adjusted under 35 U.S.C. 154(b) by 0 days.

(21) Appl. No.: 10/300,132

(22) Filed: Nov. 20, 2002

(65) Prior Publication Data

US 2003/0117774 A1 Jun. 26, 2003

Related U.S. Application Data

(63) Continuation-in-part of application No. 09/927,418, filed on Aug. 10, 2001, now abandoned.

(51) Int. Cl.⁷ .................................................. H05K 7/20
(52) U.S. Cl. ...................... 361/704; 165/80.3; 165/185; 257/707; 257/713; 361/600; 361/679; 361/710; 361/715; 361/718; 173/49
(58) Field of Search ............................... 165/80.2, 80.3, 165/185; 174/16.3, 52.2, 52.4; 257/706–707, 712–713; 361/600, 679, 704, 707–710, 715–722; 310/50, 91; 173/49, 216

(56) References Cited

U.S. PATENT DOCUMENTS

| | | | | | |
|---|---|---|---|---|---|
| 3,911,327 | A | * | 10/1975 | Murari et al. | 361/718 |
| 5,558,166 | A | * | 9/1996 | Chen | 173/49 |
| 5,909,358 | A | * | 6/1999 | Bradt | 361/707 |
| 5,926,373 | A | * | 7/1999 | Stevens | 361/704 |
| 6,320,286 | B1 | * | 11/2001 | Ramarathnam | 310/50 |

* cited by examiner

Primary Examiner—Gregory D. Thompson
(74) Attorney, Agent, or Firm—Harness, Dickey & Pierce, P.L.C.

(57) ABSTRACT

An electronic control module provides dual insulation layers between an internal line voltage and a separate tool housing that serves as a heat sink, thereby allowing versatility in mounting the electronic control module within the tool housing interior, and thereby also eliminating the risk of electrical shock to a user making contact with an exterior tool housing surface. The control module includes a power device, connected to a line voltage, and a thermal pad. The power device provides a first layer of electrical insulation between the line voltage and an external tab of the power device while the thermal pad provides a second layer of electrical insulation. The combined first and second layers provide a minimum amount of electrical insulation between the line voltage and the tool housing thereby preventing electrical shock. Alternatively, the thermal pad is provided between the control module and the tool housing.

49 Claims, 5 Drawing Sheets

ELECTRICALLY ISOLATED MODULE

CROSS REFERENCE TO RELATED APPLICATIONS

This application is a Continuation-In-Part of application U.S. Ser. No. 09/927,418, entitled Electrically Isolated Module, filed Aug. 10, 2001 now abandoned in the U.S. Patent and Trademark Office. The contents of the aforementioned Application are incorporated herein by reference, and the benefit of priority to the same Application is claimed under 35 U.S.C. §120.

BACKGROUND OF THE INVENTION

1. Technical Field

The present invention generally relates to electrically isolated control modules. More particularly, the invention relates to an electrically isolated control module having dual insulation layers between an internal line voltage and an external heat sink.

2. Discussion

Electronic devices operating on relatively high AC line voltages have existed for years. Power tools such as miter saws, belt sanders, and household appliances are but a few examples of these types of devices. The typical power tool has a voltage system providing the line voltage for the tool (based on a commercial AC source) and a tool housing enclosing the system. Control modules (such as a speed controller) are often connected to the line voltage and are also disposed within the tool housing. Thus, in the case of a miter saw, the speed controller may control the rotational speed of the saw blade based on the line voltage and one or more switching signals. In order to avoid electric shock to individuals touching the outside of the tool housing, such a controller is typically embedded into an internal enclosure and positioned far enough away from the tool housing to provide the desired amount of electrical isolation between the tool housing and the line voltage.

While the above-described approach to electrically isolating a control module is acceptable under some circumstances, certain difficulties remain. For example, as the size of power tools and the amount of available airflow within the tool decreases, the flexibility in positioning the module within the tool also decreases. This fact is particularly troublesome considering the exacting requirements of modern day safety standards. For example, Underwriters Laboratories (UL) requires a minimum of 3700 volts of isolation between the AC line voltage and any user-accessible (or user-graspable) housing of a tool or appliance. Design engineers are encountering considerable difficulty in meeting this requirement given the creepage and clearance constraints dictated by these safety standards. It is therefore desirable to provide an electrically isolated module that is highly flexible with respect to module placement in relation to user-accessible housings.

SUMMARY OF THE INVENTION

The above and other objectives are provided by a power tool in accordance with the principles of the present invention. The tool has a voltage system providing a line voltage for the tool and a user-graspable tool housing enclosing the voltage system. A double insulated (DI) control module is connected to the line voltage and mechanically coupled to an interior tool housing surface such that the metal tool housing itself functions as a heat sink for the control module. By mechanically coupling the control module to an interior tool housing surface, flexibility in the interior design of the tool as well as control module placement within the tool housing is significantly increased.

Further in accordance with the present invention, an electronic module is provided. The module includes a power device and a thermal pad. The power device is connected to a line voltage, where the power device provides a first layer of electrical insulation between the line voltage and an external tab of the power device. The thermal pad is disposed between the external tab and a heat sink. The thermal pad provides a second layer of electrical insulation between the external tab and the heat sink. Thus, the first and second layers combine to provide a predetermined minimum amount of electrical insulation between the line voltage and the heat sink.

In another aspect of the invention, a method for isolating a line voltage from a heat sink is provided. The method includes the steps of electrically connecting a power device to the line voltage, and providing a first layer of electrical insulation between the line voltage and an external tab of the power device. The method further provides for positioning a thermal pad between the heat sink and tool housing such that the thermal pad provides a second layer of electrical insulation between the heat sink and tool housing. Isolation is therefore provided by the combination of the first and second layers.

It is to be understood that both the foregoing general description and the following detailed description are merely exemplary of the invention and are intended to provide an overview or framework for understanding the nature and character of the invention as it is claimed. The accompanying drawings are included to provide a further understanding of the invention, and are incorporated in and constitute part of this specification. The drawings illustrate various features and embodiments of the invention, and together with the description serve to explain the principles and operation of the invention.

BRIEF DESCRIPTION OF THE DRAWINGS

The various advantages of the present invention will become apparent to one skilled in the art by reading the following specification and sub-joined claims and by referencing the following drawings, in which:

DETAILED DESCRIPTION OF THE PREFERRED EMBODIMENTS

The following description of the preferred embodiments) is merely exemplary in nature and is in no way intended to limit the invention, its application, or uses.

Figure 1:
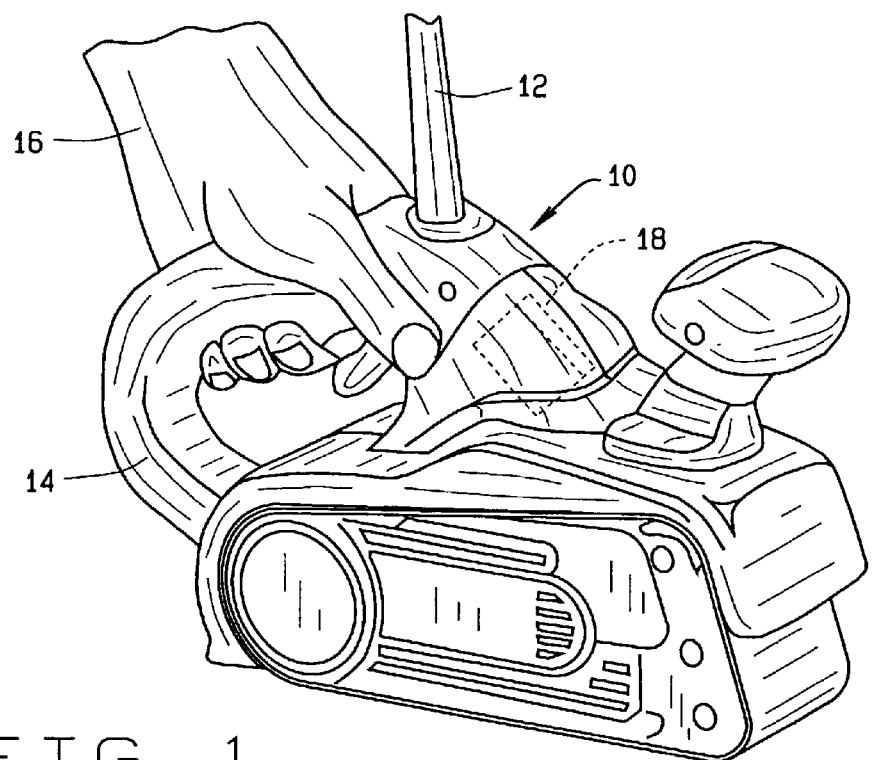
FIG. 1 is a perspective view of a power tool with a user-accessible tool housing in accordance with the principles of the present invention.

Turning now to FIG. 1, a perspective view of an exemplary power tool 10 is shown. It should be noted that while the present invention will be primarily described with respect to power tools and appliances, the invention is not so limited. In fact, the principles described herein can improve the functionality of any electronic device in which electrical isolation is desired. Furthermore, the control module described below is only one type of electronic module that can benefit from the present invention. Thus, sensing modules, power supply modules, display modules and other electronic modules can be improved using the principles described herein. Notwithstanding, the following discussion will demonstrate that power tool control modules have a number of aspects for which the present invention is uniquely suited. Turning to the present invention, it can be seen that the power tool 10 has a power cord 12 for providing AC power to the tool 10, and a tool housing 14 that is accessible by a user 16. Tool housing 14 encloses a portion of the power cord 12 while the location of a control module 18 of the present invention is shown in phantom. It will be appreciated that the module 18 could be supported within the tool 10 at different locations within the tool. The illustration of the control module 18 as being within the handle portion therefore represents one suitable internal area of the tool 10 where the control module 18 could be located. The housing 18 may be entirely of a metallic material or some portions thereof may be made from other materials such as plastic.

Figure 2:
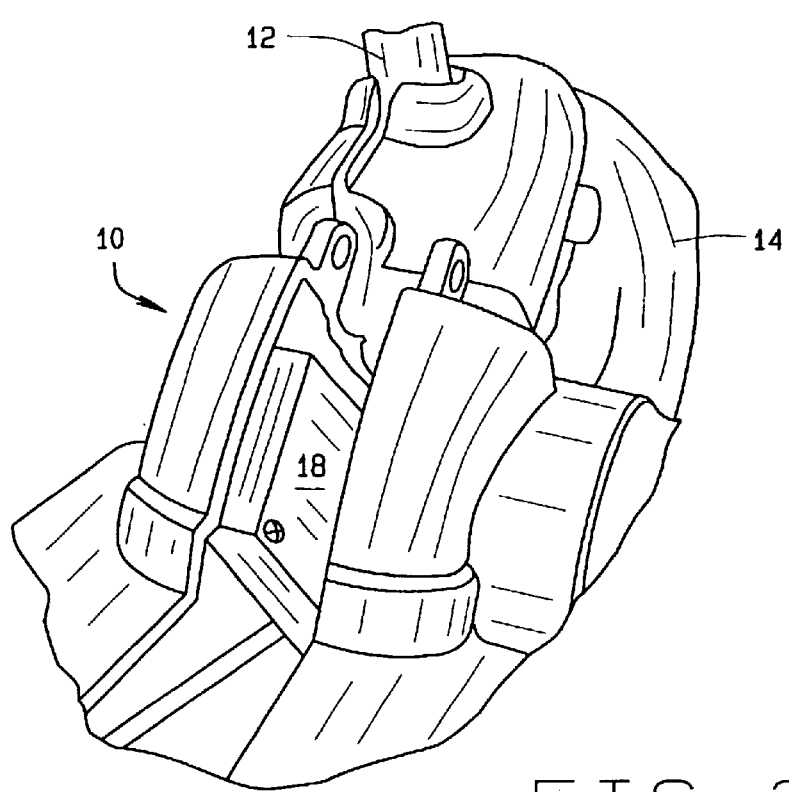
FIG. 2 is a perspective view of a power tool housing showing a representative control module location in accordance with the principles of the present invention.
Figure 3:
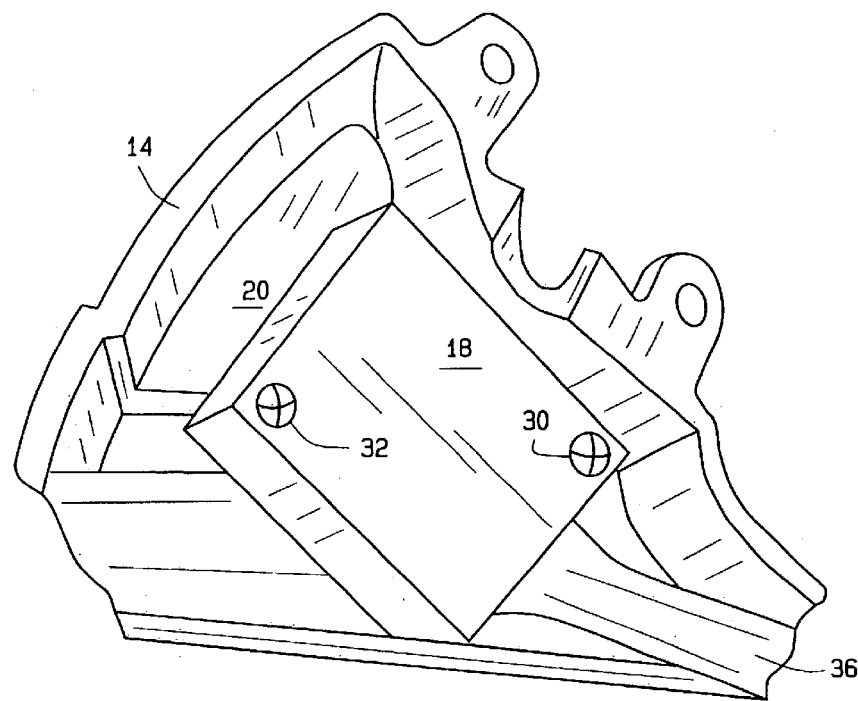
FIG. 3 is a perspective view of a power tool housing cavity showing a control module in accordance with the principles of the present invention.

With additional reference to FIGS. 2 and 3, it is shown generally how the control module 18 connects to the power cord 12 and mechanically couples to an interior surface 20 of the tool housing 14 such that the tool housing 14 functions as a heat sink for the electronic control module 18. While the discussion herein will primarily refer to the specific use of the heat sink as a tool housing 14, it will be appreciated that the heat sink is not limited to such an application. Nevertheless, by coupling the control module 18 directly to the tool housing 14, significant space savings and flexibility in mounting the control module 18 are realized.

With continued reference to FIGS. 1–3, it is important to note that the power tool 10, being operated by a user 16, has various external surfaces that are accessible or touchable by the user 16 or which otherwise make user 16 contact. Furthermore, at least portions of the tool housing 14 are often made of a material that is electrically conductive, such as a metal alloy. Alternatively, an insulating material such as plastic comprises the tool housing 14 or the exterior surface of the tool housing 14. Thus, the AC source supplying power to the power cord 12 to which the control module 18 is connected, must be electrically isolated from the tool housing 14 in order for a user 16 to avoid electrical shock.

Figure 4:
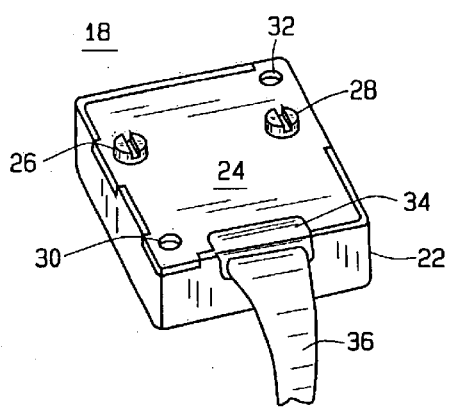
FIG. 4 is a perspective view of an electronic control module in accordance with the principles of the present invention.
Figure 5:
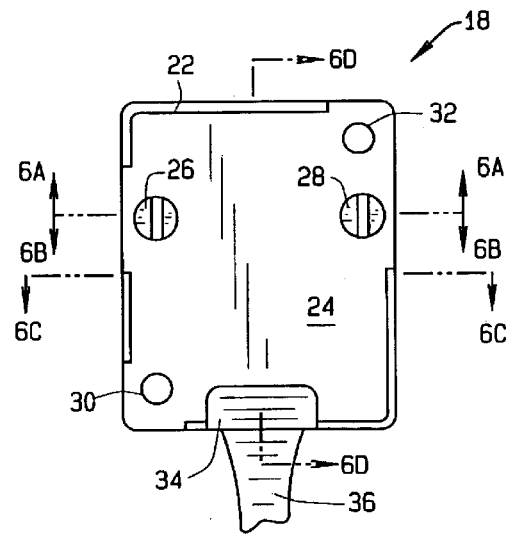
FIG. 5 is a plan view of the electronic control module shown in FIG. 4.

Turning now to FIGS. 4 and 5, the electronic control module 18 is shown in greater detail. The control module 18 has a housing 22 forming a container with a heat sink cover 24 secured to the module housing 22 by screws 26 and 28. The control module 18 is secured to a mounting surface, such as interior surface 20 of tool housing 14 as shown in FIG. 3, by fastening members which extend through holes 30 and 32. Alternatively, the control module 18 may be secured to a mounting surface by an adhesive. The heat sink cover 24 and module housing 22 provide a gap 34 for a wiring harness 36 to pass and be operatively coupled to the power cord 12. Furthermore, the module housing 22 encloses a circuit board, power device and thermal pad (to be described below).

With reference to FIGS. 6A–6D, the structure of the control module 18 will be explained in greater detail. Specifically, it can be seen that the control module 18 includes a power device 38 and a thermal pad 40. The power device 38 is preferably an isolated-tab thyristor and is electrically connected to an AC voltage source. By selecting the power device 38 to be an isolated-tab power device, an external tab 42 of the power device 38 is electrically isolated from the AC voltage source. Isolated-tab thyristors are commercially available and commonly provide a minimum breakdown voltage of 2700 volts. Thus, the power device 38 provides a first layer of electrical insulation between the line voltage and the external tab 42.

The thermal pad 40 is disposed between the external tab 42 and the heat sink cover 24. The thermal pad 40 provides a second layer of electrical insulation between the external tab 42 and the heat sink cover 24. Thus, the power device 38 and thermal pad 40 combine to provide a predetermined amount of electrical insulation between the AC source and the tool housing 14 (FIG. 1). This double layer of insulation enables a user 16 to contact all external surfaces of the tool housing 14 without fear or risk of electrical shock. Additionally, this double layer of insulation meets TUV and UL requirements with respect to insulation and control module 18 spacing requirements from a user contact surface.

Figure 6A:
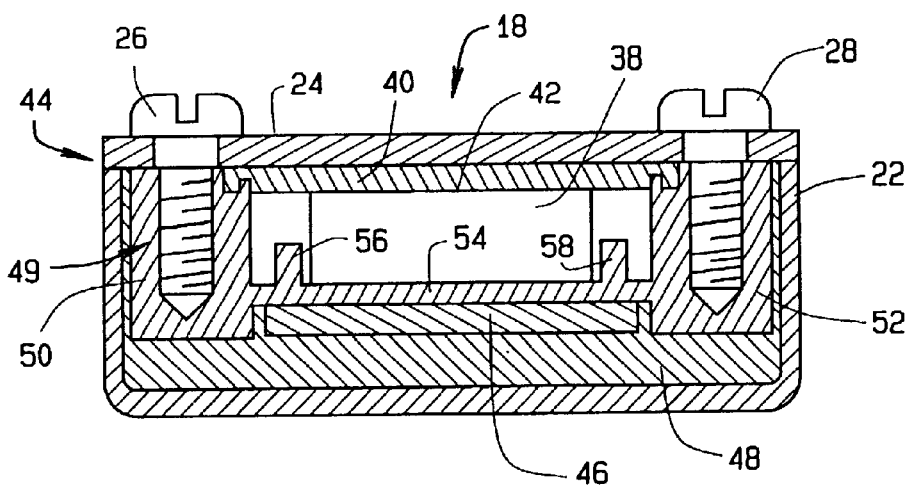
FIG. 6A is a section view of the control module taken along lines 6A—6A shown in FIG. 5.
Figure 6B:
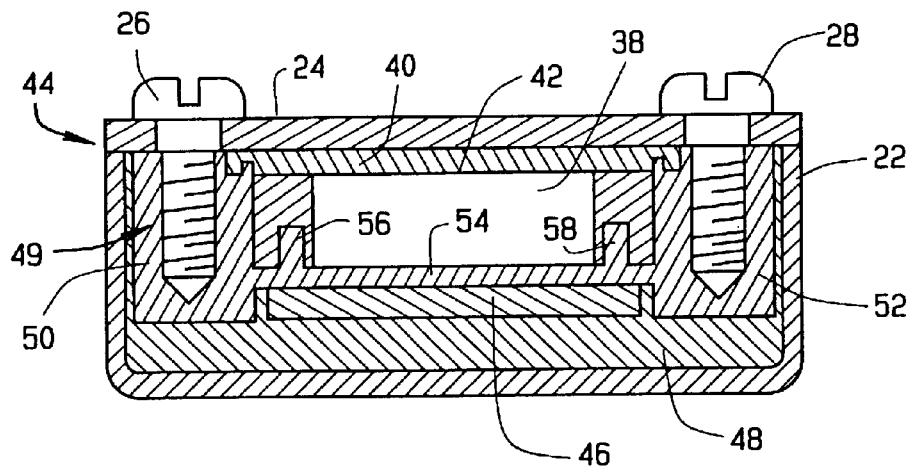
FIG. 6B is a section view of the control module taken along lines 68-6B shown in FIG. 5.
Figure 6C:
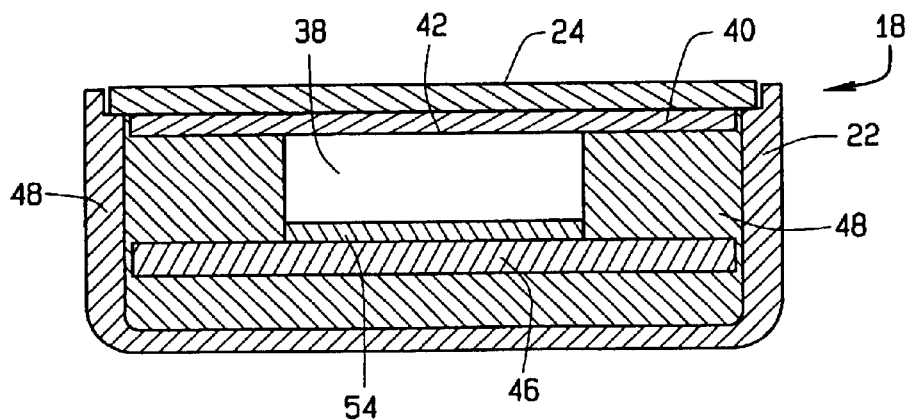
FIG. 6C is a section view of the control module taken along lines 6C—6C shown in FIG. 5.

With regard to the thermal pad 40 of FIGS. 6A and 6B, it will be appreciated that a connection mechanism 44 is coupled to the module housing 22. The connection mechanism is formed by screws 26 and 28 and a support component 49. The support component 49 is formed by a first post 50, a second post 52 and a bridge 54 extending between the posts 50 and 52. The connection mechanism 44 functions to compress the thermal pad 40 to a controlled minimum thickness of about 1.0 mm. One such thermal pad 40, for example, is available from Fuji Polymer Industries of Japan under the trade name Sarcon®. This material provides a minimum of approximately 2000 volts of electrical insulation and is compressed to a thickness of approximately 1.1 mm. This 1.1 mm thickness meets the mechanical UL requirement for isolation. Considerations in selecting the thermal pad 40 include strength of the material, softness, thermal conductivity, and electrical conductivity.

Figure 6D:
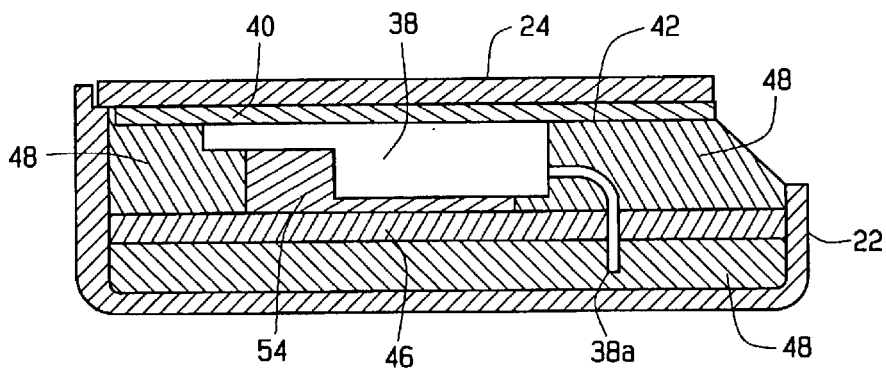
FIG. 6D is a section view of the control module taken along lines 6D—6D shown in FIG. 5.

With reference to FIGS. 5–6D, it will be appreciated that a wiring harness 36 couples the AC line voltage from the power cord 12 to the control module 18. The circuit board 46 is coupled to the power device 38 and to the wiring harness 36. The circuit board 46 contains conductors for coupling the AC line voltage to the power device 38. As already mentioned, the control module 18 includes a module housing 22 coupled to the tool housing 14, where the module housing 22 encloses the circuit board 46, the power device 38 and the thermal pad 40. A potting compound 48 is disposed within the module housing 22 to provide required further isolation, structural support, and environmental protection. Acceptable potting compounds are commercially available from a number of well known sources.

Continuing with reference to FIGS. 6A and 6B, a method of connection of the control module 18 will now be explained. The preferred connection mechanism 44 includes the support member 49 having the first post 50, contacting a first edge of the circuit board 46, and the first screw 26, coupled to the first post 50. The second post 52 contacts a second edge of the circuit board 46, while the second screw 28 couples to the second post 52. It can also be seen that the bridge 54 includes wall portion 56 and portion 58 which cooperatively form a receptacle for nesting the power device 38 therein. The bridge 54 is also responsible for maintaining the required thickness of the thermal pad 40 between the external tab 42 and the heat sink cover 24, enhancing the mechanical support provided to the power device 38, and maintaining isolation between screws 26 and 28 and the AC line voltage. The support member 49 is preferably made of plastic, and preferably formed as a single integral formed component.

Assembling the control module 18 of the present invention entails soldering the power device 38 to the circuit board 46 including bending an electrical lead of the power device 38 into a generally "L" shaped configuration 38a that extends into and through the circuit board 46 and into the potting compound 48 as shown in FIG. 6D. The bridge 54 is disposed between the power device 38 and the circuit board 46. The thermal pad 40 is then applied to the heat sink cover 24, and the thermal pad 40 and heat sink cover 24 assembly is coupled to the circuit board 46 and associated bridge 54, via the connection mechanism 44 shown in FIGS. 6A and 6B. Upon securing screws 26 and 28, the circuit board 46, connection mechanism 44, and thermal pad 40 assembly is disposed within the module housing 22 and then potted with the potting compound 48.

Figure 7:
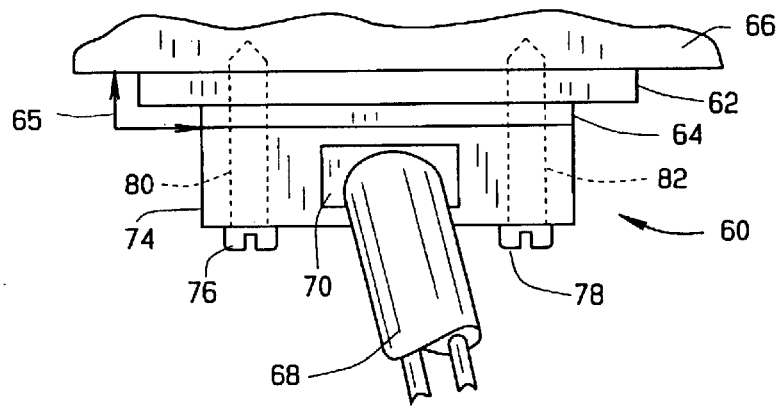
FIG. 7 is a perspective view of an alternative embodiment of a control module mounted to an exterior of a power tool housing showing an external thermal pad.

Turning now to FIG. 7, an alternative embodiment of a control module 60 in accordance with the present invention is shown. The control module 60 includes a thermal pad 62 interposed between a module heat sink cover 64 and a tool housing 66. The thermal pad 62 is preferably approximately 1.2 mm thick and provides the additional insulation necessary to surpass current DI standards for Europe and the United States. A wiring harness 68 extends through an aperture 70 defined by a housing surface 72 of a module housing 74. Screws 76 and 78 extend through holes 80 and 82, respectively, for attachment of the module housing 74 to the tool housing 66. Also, a creepage and clearance distance/path between the tool housing 66 and the heat sink cover 64, in accordance with arrow 65, needs to be provided of about 4 mm.

Through the configuration of FIG. 7, the tool housing 66 is usable as a heat sink for the control module 60 without risk of electrical shock if user contact is made with tool housing 66. Unlike the embodiment of FIGS. 1–6D, the control module 60 of the FIG. 7 embodiment does not possess a thermal pad 40 enclosed within the control module 18, as shown in FIGS. 6A–6D. Alternatively, control module 60 exemplifies an external thermal pad 62 approach to a dual insulation layer concept. It should also be noted that wiring harness 68 must meet applicable UL insulation requirements.

Figure 8A:
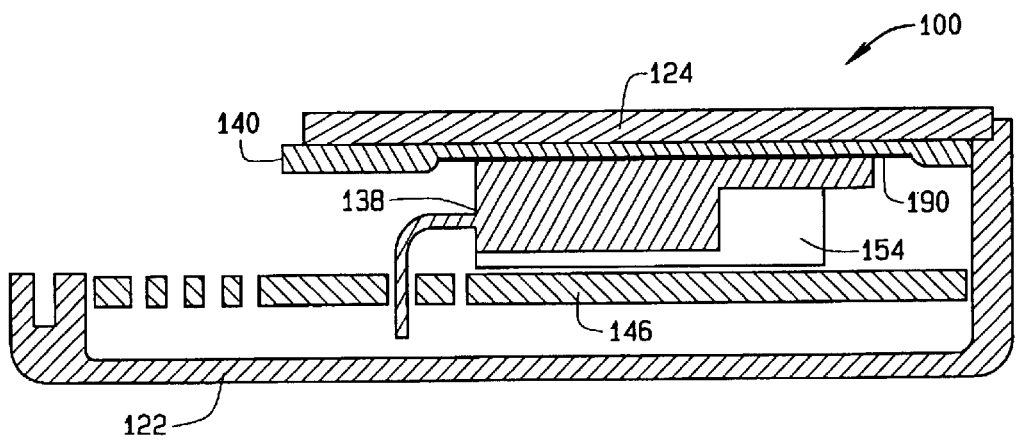
FIG. 8A is a section view of another alternate embodiment of the control module taken along line 6D—6D shown in FIG. 5 including a third layer of insulation.
Figure 8B:
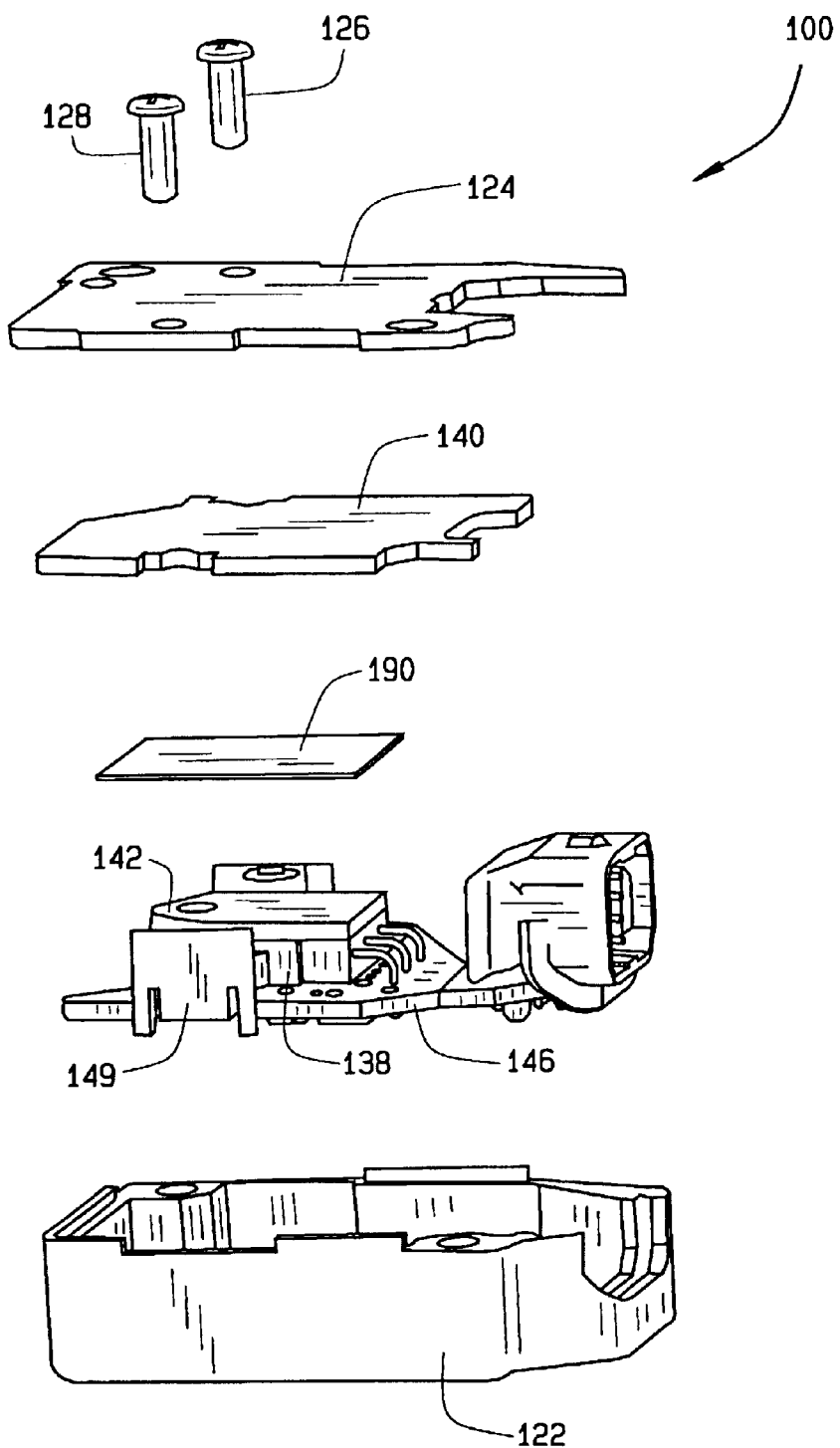
FIG. 8B is an exploded view of the control module shown in FIG. 8A.

Turning now to FIGS. 8A and 8B, a control module 100 is shown. The control module 100 is an alternate preferred embodiment of the control module 18 (shown in FIGS. 4–6D) including a third layer of insulation, in accordance with the present invention, is shown. Components shown in FIGS. 8A and 8B identical to components in FIGS. 4–6D are identified in FIGS. 8A and 8B using the same reference numerals used in FIGS. 4–6D incremented by 100. A third layer of insulation between the AC power source and the tool housing 14 (shown in FIG. 1) is provided by disposing an insulator 190 between the thermal pad 140 and the power device 138. Therefore, the power device 138, thermal pad 140, and insulator 190 combine to provide a triple layer of electrical insulation between the AC power source and the tool housing 14 that enables the user 16 (shown in FIG. 1) to contact all external surfaces of the tool housing 14 without fear or risk of electrical shock. Additionally, this triple layer of insulation meets TUV and UL requirements with respect to insulation from a user contact surface.

In one preferred embodiment, the insulator 90 is disposed between the thermal pad 140 and the power device 138 by using a suitable adhesive to secure the insulator 190 to the control module external tab 142. Alternatively, any suitable retaining means can be used to dispose and hold the insulator 190 in place between the thermal pad 140 and the power device 138. For example, by screwing the heat sink cover 124 to the bridge 149 the thermal pad 140 is compressed over the insulator 190 thereby holding the insulator 190 in place against the external tab 142. The insulator 190 is sized such that the surface area of the insulator 190 is equal to or greater than the surface area of the external tab 142, and shaped such that the entire surface area of the external tab 142 is encompassed by the insulator 190.

Additionally, the insulator 190 is constructed of an electrically insulating material suitable to comply with TUV and UL requirements. For example, insulator 190 can be constructed of a silicone based material available from The Bergquist Company under the trade name Sil-Pad®. The electrically insulating value, i.e. dielectric breakdown value, of the insulator 190 is chosen such that the electrically insulating value of the power device 138 and/or the thermal pad 140 can vary while still maintaining a desired minimum value of electrical insulation between the AC power source and the tool housing 14. Preferably, the three layers of insulation provide a minimum of approximately 3750 volts of isolation between any two layers. More specifically, the power device 138 and the insulator 190 combined, the power device 138 and the thermal pad 140 combined, and the insulator 190 and the thermal pad 140 combined, each provide a minimum of approximately 3750 volts of insulation between the AC power source and the tool housing 14. Thus, disposing the insulator 190 between the power device 138 and the thermal pad 140 provides additional electrical insulation to the power module 100 and flexibility in the electrically insulating values of each of the three layers of insulation.

An electronic control module 18 and 100 is therefore provided that offers a dual or a triple insulation arrangement between the AC power source and the tool housing 14. The tool housing 14 also serves as a heat sink, thereby allowing versatility in mounting the electronic control module 18, 100 to the interior surface 20 and also eliminating the risk of electrical shock to a user 16 making contact with the tool housing 14. Additionally, the double insulated control module 18 or 100 meets or exceeds TUV and UL standards for its application within a tool housing 14.

Those skilled in the art can now appreciate from the foregoing description that the broad teachings of the present invention can be implemented in a variety of forms. Therefore, while this invention can be described in connection with particular examples thereof, the true scope of the invention should not be so limited since other modifications will become apparent to the skilled practitioner upon a study of the drawings, specification and following claims.

What is claimed:

1. An electronic module adapted to be disposed within a housing of an AC powered power tool and to make use of a portion of the housing as a heat sink, the module comprising:
   a power device having an external tab and being coupled to a line voltage source, the power device providing a first layer of electrical insulation between the line voltage source and the power tool housing; and
   a thermal pad disposed between the external tab and a power tool housing, the thermal pad providing a second layer of electrical insulation between the line voltage source and the power tool housing;
   the first and second layers combining to provide a predetermined minimum amount of electrical insulation between the line voltage source and the power tool housing while enabling the power tool housing to function as a heat sink to dissipate heat developed by the power device.

2. The electronic module of claim 1 further comprising an insulator disposed between the external tab and the thermal pad, the insulator providing a third layer of insulation between the line voltage and the power tool housing, wherein the first, second and third layers combine to provide a predetermined minimum amount of electrical insulation between the line voltage source and the power tool housing.

3. The electronic module of claim 2, wherein the combination of the power device and the insulator provide at least approximately 3750 volts of insulation between the line voltage and the power tool housing.

4. The electronic module of claim 2, wherein the combination of the power device and the thermal pad provide at least approximately 3750 volts of insulation between the line voltage and the power tool housing.

5. The electronic module of claim 2, wherein the combination of the insulator and the thermal pad provide at least approximately 3750 volts of insulation between the line voltage and the power tool housing.

6. The electronic module of claim 1 further comprising a bridge support, the bridge support comprising a first wall and a second wall to form a receptacle to receive the power device therewithin.

7. The electronic module of claim 6 wherein the bridge support further comprising a first post and a second post, the first post and the second post being spaced apart from one another and used for securing the power device within the module.

8. The electronic module of claim 1 further comprising a circuit board, the circuit board being fixedly coupled to the power device.

9. The electronic module of claim 8, wherein the module further comprises a module housing, and a layer of potting compound disposed within the module housing to support the circuit board on the layer within the module housing.

10. The electronic module of claim 9 wherein the potting compound is placed within the module housing to fill voids within the module housing after the electronic module assembly is fully assembled.

11. An AC powered power tool having an electronic control module disposed within a tool housing of the power tool, the tool housing acting as a heat sink for the electronic control module, the power tool comprising:
   a line voltage passing through the tool housing and connecting to the electronic control module which nests within the tool housing, the electronic control module comprising:
      a power device, the power device connecting to the line voltage and providing a first layer of electrical insulation between the line voltage and a power tab of the power device; and
      a thermal pad, wherein the thermal pad is disposed between the power tab and a control module cover, the thermal pad providing a second layer of electrical insulation between the power tab and the cover and providing a predetermined minimum amount of electrical insulation between the line voltage and the tool housing to prevent electrical shock to a user contacting an external surface of the tool housing wherein the tool housing and the control module cover also act as heat sinks to dissipate heat developed by the power device.

12. The power tool of claim 11, wherein the electronic control module further comprises an insulator disposed between the external tab and the thermal pad, the insulator providing a third layer of insulation between the power tab and the thermal pad, wherein the combination of the first, second and third layers provide a predetermined minimum amount of electrical insulation between the line voltage and the tool housing to prevent electrical shock to a user contacting an external surface of the tool housing.

13. The power tool of claim 12, wherein the combination of the first layer and the second layer provide at least approximately 3750 volts of insulation between the line voltage and the power tool housing.

14. The power tool of claim 12, wherein the combination of the first layer and the third layer provide at least approximately 3750 volts of insulation between the line voltage and the power tool housing.

15. The power tool of claim 12, wherein the combination of the second layer and the third layer provide at least approximately 3750 volts of insulation between the line voltage and the power tool housing.

16. The power tool of claim 11, wherein the control module further comprises a connection mechanism comprising:
   a first post on a first side of the power device;
   a second post on a second side of the power device;
   a bridge portion connecting the first post and the second post, the posts containing threads and securing a first screw and a second screw, respectively.

17. The power tool of claim 16 wherein the bridge portion of the connection mechanism holds the power device and the thermal pad against the control module cover when the first screw and the second screw are tightened.

18. The power tool of claim 17 wherein the thermal pad is compressed to a minimum thickness of 1 mm.

19. The power tool of claim 11, wherein the tool housing comprises an inside surface and an outside surface, the tool housing acting as a heat sink for the control module for heat radiated by the control module when the control module is attached to the inside surface of the tool housing.

20. The power tool of claim 11 further comprising a circuit board, the circuit board contacting the power device within the control module.

21. The power tool of claim 20 further comprising a potting compound, the potting compound providing a foundation to secure the circuit board within the control module.

22. An electrically isolated, double insulated electronic control module for use in a power tool, the electronic control module comprising:
   a module housing, the module housing having four walls, a bottom portion connected to the four walls at one end of the four walls, the four walls having an end opposite the bottom portion thereby defining an opening;
   a cover that covers the opening of the module housing;

a power device having a first side and a second side, the power device second side facing the cover, the power device first side situated on a first side of a bridge portion, the bridge portion comprising a first wall and a second wall to form a receptacle to receive the power device therewithin, a first post and a second post, the first post and the second post each linking to the cover by a first fastener and a second fastener, respectively;

a thermal pad having a first side and a second side, the first side situated against the cover and the second side situated against the second side of the power device, the first fastener and the second fastener holding the bridge portion, the power device, and the thermal pad against the module housing cover; and a circuit board having a first side and a second side, the first side of the circuit board situated against a second side of the bridge portion, and the second side of the circuit board situated against a layer of potting compound which rests upon the bottom portion of the module housing.

23. An electrically isolated, triple insulated electronic control module for use in a power tool, the electronic control module comprising:

a module housing, the module housing having four walls, a bottom portion connected to the four walls at one end of the four walls, the four walls having an end opposite the bottom portion thereby defining an opening;

a cover that covers the opening of the module housing;

a power device having a first side and a second side, the power device second side facing the cover, the power device first side situated on a first side of a bridge portion, the bridge portion comprising a first wall and a second wall to form a receptacle to receive the power device therewithin, a first post and a second post, the first post and the second post each linking to the cover by a first fastener and a second fastener, respectively;

an insulator having a first side and a second side, the insulator first side facing the cover and the insulator second side situated against the second side of the power device;

a thermal pad having a first side and a second side, the thermal pad first side situated against the cover and the thermal pad second side situated against the first side of the insulator, the first fastener and the second fastener holding the bridge portion, the power device, the insulator, and the thermal pad against the module housing cover; and a circuit board having a first side and a second side, the first side of the circuit board situated against a second side of the bridge portion, and the second side of the circuit board situated against a layer of potting compound which rests upon the bottom portion of the module housing.

24. An electrically isolated, double insulated electronic control module for use in a power tool housing, the electronic control module comprising:

a module housing, the module housing having four walls, a bottom portion connected to the four walls at one end of the four walls, the four walls having an end opposite the bottom portion thereby defining an opening;

a cover that covers the opening of the module housing;

a power device having a first side and a second side, the power device second side facing the cover, the power device first side situated on a first side of a bridge portion, the bridge portion comprising a first wall and a second wall to form a receptacle to receive the power device therewithin, a first post and a second post, the first post and the second post each linking to the cover by a first fastener and a second fastener, respectively;

a thermal pad having a first side and a second side, the first side situated against the cover and the second side situated against a power tool housing, the first fastener and the second fastener holding the bridge portion and the power device against the module housing cover; and a circuit board having a first side and a second side, the first side of the circuit board situated against a second side of the bridge portion, and the second side of the circuit board situated against a layer of potting compound which rests upon the bottom portion of the module housing.

25. A method for isolating an alternating current (AC) line voltage applied to a power tool to power the power tool, from an external housing of the power tool, and wherein the power tool includes an internally mounted component responsive to the AC line voltage, the method comprising:

implementing a first level of electrical insulation between a power cord of the power tool and the external housing of the power tool;

implementing a second level of electrical insulation between the power cord and the housing of the power tool; and using a portion of the housing as a heat sink to help remove heat from the internally mounted component.

26. The method of claim 25, wherein implementing the first level of electrical insulation includes using a power generating component disposed within the internally mounted component.

27. The method of claim 25, wherein implementing the second level of electrical insulation includes using a layer of electrically insulative material disposed between a power generating component disposed within the internally mounted component and a cover of the power generating component.

28. The method of 25, further comprising implementing a third level of electrical insulation to further insulate the AC line voltage from the external housing of the power tool.

29. A method of operating a power tool comprising:

using a power cord to supply an alternating current (AC) line voltage to a module mounted to an internal surface of a housing of the power tool;

supporting a housing of the module from the interior surface of the tool housing to cause a portion of the tool housing to function as a heat sink for the module;

using a power generating component disposed within the module to provide a first level of electrical isolation between the AC line voltage and the tool housing; and using a layer of electrically insulative material between a cover of the module and the power generating component to provide an independent, second level of electrical isolation between the AC line voltage and the tool housing.

30. The method of claim 29, further comprising:

using an additional layer of electrically insulative material disposed within the module for providing a third, independent layer of electrical isolation between the AC line voltage and the tool housing.

31. A method for isolating a line voltage from a power tool housing, wherein the line voltage is used to power a motor within the power tool, the method comprising:

providing a layer of electrical insulation between the line voltage and an external tab of a power device included in a module connectable to the line voltage and the power tool housing, thereby providing a first layer of electrical insulation between the line voltage and the power tool housing; and disposing a thermal pad between a heat sink cover of the module and the external tab of the power device, thereby providing a second layer of electrical insulation between the line voltage and the power tool housing; and connecting the module to an internal surface of the power tool, such that the power tool housing functions as a heat sink for the module.

32. The method of claim 31, wherein providing a layer of electrical insulation between the line voltage and the external tab comprises utilizing at least one internal electrically isolative property of the power device to provide the first layer of electrical insulation.

33. The method of claim 31 further comprising combining the first and second layers to provide a predetermined minimum amount of electrical insulation between the line voltage source and the power tool housing.

34. The method of claim 31, wherein disposing the thermal pad between the heat sink cover and the external tab comprises:

securing the power device within a bridge support;

positioning the thermal pad over an outer surface of the external tab; and securing the heat sink cover to the bridge such that the thermal pad is compressed between the external tab and the heat sink cover.

35. The method of claim 31 further comprising disposing an insulator between the external tab and the thermal pad, thereby providing a third layer of electrical isolation between the line voltage and the power tool housing.

36. The method of claim 35 further comprising providing approximately 3750 volts of insulation between the line voltage and the power tool housing utilizing any two of the first layer, the second layer, and the third layer.

37. An electronic module adapted to provide electrical insulation between a power source a housing of a power tool, the module comprising:

a means for providing a first layer of electrical insulation between the power source and a component of a power device included in the module and responsive to the power source;

a means for providing a second layer of electrical insulation between the component and a cover for the module; and a means for connecting the module to an internal surface of the power tool housing, thereby utilizing the power tool housing as a heat sink for the module.

38. The electronic module of claim 37, wherein the first and second layers combine to provide a predetermined minimum amount of electrical insulation between the power source and the power tool housing.

39. The electronic module of claim 37 wherein the means for providing the first layer comprises the power device.

40. The electronic module of claim 39, wherein the means for providing the second layer comprises a thermal pad disposed against the component.

41. The electronic module of claim 40 further comprising a means for securing the thermal pad between the component of the power device and the cover.

42. The electronic module of claim 41, wherein the means for securing the thermal pad between the component and the cover comprises a bridge adapted to retain the power device and couple to the cover such that the thermal pad is compressed between the component and the cover.

43. The electronic module of claim 41 further comprising a means for providing a third layer of insulation between the power device and the cover, wherein the first, second and third layers combine to provide a predetermined minimum amount of electrical insulation between the line voltage source and the power tool housing.

44. The electronic module of claim 43, wherein the means for providing the third layer comprises a layer of electrically insulative material.

45. The electronic module of claim 37 further comprising a means for providing a third layer of electrical insulation between the means for providing the first layer of electrical insulation and the means for providing the second layer of electrical insulation.

46. The electronic module of claim 45, wherein the means for proving the third layer comprises a layer of electrically insulative material.

47. An alternating current (AC) powered power tool comprising:

a housing;

a motor supported within the housing for providing torque to the power tool;

an electronic control module responsive to an AC line voltage and disposed within a housing of the power tool such that the tool housing acts as a heat sink for the electronic control module, wherein the electronic control module comprises:

a power device disposed in the electronic control module, the power device being responsive to the AC line voltage and providing a first layer of electrical insulation between the AC line voltage and a portion of the power device; and a thermal pad, wherein the thermal pad is disposed between the portion of the power device and a control module cover, the thermal pad providing a second layer of electrical insulation between the portion and the cover and providing a predetermined minimum amount of electrical insulation between the AC line voltage and the tool housing, wherein the tool housing acts as a heat sink to dissipate heat in the electronic control module by the power device.

48. The power tool of claim 47, wherein the electronic control module further comprises an insulator disposed between the portion of the power device and the thermal pad, the insulator providing a third layer of insulation between the power tab and the thermal pad, wherein the combination of the first, second and third layers provide a predetermined minimum amount of electrical insulation between the AC line voltage and the tool housing.

49. The power tool of claim 48, wherein the electronic control module further comprises a bridge adapted to retain the power device and couple to the cover such that the thermal pad is compressed between the insulator and the cover.

* * * * *